(12) United States Patent
Kim et al.

(10) Patent No.: US 11,785,761 B2
(45) Date of Patent: Oct. 10, 2023

(54) SEMICONDUCTOR MEMORY DEVICES

(71) Applicant: Samsung Electronics Co., Ltd., Suwon-si (KR)

(72) Inventors: Hui-Jung Kim, Seongnam-si (KR); Min Hee Cho, Suwon-si (KR); Bong-Soo Kim, Yongin-si (KR); Junsoo Kim, Seongnam-si (KR); Satoru Yamada, Yongin-si (KR); Wonsok Lee, Suwon-si (KR); Yoosang Hwang, Suwon-si (KR)

(73) Assignee: Samsung Electronics Co., Ltd.

( * ) Notice: Subject to any disclaimer, the term of this patent is extended or adjusted under 35 U.S.C. 154(b) by 137 days.

(21) Appl. No.: 17/240,486

(22) Filed: Apr. 26, 2021

(65) Prior Publication Data
US 2021/0249417 A1    Aug. 12, 2021

Related U.S. Application Data

(63) Continuation of application No. 16/820,006, filed on Mar. 16, 2020, now Pat. No. 10,991,699, which is a
(Continued)

(30) Foreign Application Priority Data

Aug. 10, 2017    (KR) .................. 10-2017-0101835

(51) Int. Cl.
*H10B 12/00*    (2023.01)
*H01L 21/28*    (2006.01)
(Continued)

(52) U.S. Cl.
CPC ....... *H10B 12/34* (2023.02); *H01L 21/28088* (2013.01); *H01L 29/0649* (2013.01);
(Continued)

(58) Field of Classification Search
CPC .......... H01L 29/4966; H01L 27/10891; H01L 27/10876; H01L 21/28088; H01L 27/10823
(Continued)

(56) References Cited

U.S. PATENT DOCUMENTS 7,902,597 B2    3/2011    Lee et al.
7,923,331 B2    4/2011    Han et al.
(Continued)

FOREIGN PATENT DOCUMENTS

CN    101944531 A    1/2011
JP    2011192800 A    9/2011
(Continued)

*Primary Examiner* — Bo Fan
(74) *Attorney, Agent, or Firm* — Myers Bigel, P.A.

(57) ABSTRACT

Semiconductor memory devices are provided. A semiconductor memory device includes an isolation layer in a first trench and a first gate electrode portion on the isolation layer. The semiconductor memory device includes a second gate electrode portion in a second trench. In some embodiments, the second gate electrode portion is wider, in a direction, than the first gate electrode portion. Moreover, in some embodiments, an upper region of the second trench is spaced apart from the first trench by a greater distance, in the direction, than a lower region of the second trench. Related methods of forming semiconductor memory devices are also provided.

20 Claims, 12 Drawing Sheets

Related U.S. Application Data continuation of application No. 15/952,308, filed on Apr. 13, 2018, now Pat. No. 10,615,164.

(51) Int. Cl.
  *H01L 29/49* (2006.01)
  *H01L 29/06* (2006.01)

(52) U.S. Cl.
  CPC ....... *H01L 29/4966* (2013.01); *H10B 12/053* (2023.02); *H10B 12/315* (2023.02); *H10B 12/488* (2023.02)

(58) Field of Classification Search
  USPC .......................... 257/368, 296, 330, 446, 229
  See application file for complete search history.

(56) References Cited

U.S. PATENT DOCUMENTS

| | | |
|---|---|---|
| 7,947,553 B2 | 5/2011 | Kim |
| 8,053,315 B2 | 11/2011 | Tai et al. |
| 8,120,099 B2 | 2/2012 | Seo et al. |
| 8,975,140 B2 | 3/2015 | Chung |
| 9,136,135 B2 | 9/2015 | Baek et al. |
| 9,391,206 B2 | 7/2016 | Pandey et al. |
| 9,530,883 B2 | 12/2016 | Deng et al. |
| 9,570,404 B2 | 2/2017 | Pang et al. |
| 9,673,276 B2 | 6/2017 | Kim et al. |
| 2008/0003753 A1 | 1/2008 | Seo et al. |
| 2010/0102371 A1* | 4/2010 | Yeom .................... H10B 12/488 257/296 |
| 2011/0001186 A1 | 1/2011 | Seo et al. |
| 2011/0101450 A1 | 5/2011 | Kim |
| 2015/0255614 A1 | 9/2015 | Nagai et al. |
| 2015/0340453 A1* | 11/2015 | Cho .................... H01L 29/7831 257/330 |
| 2015/0349073 A1 | 12/2015 | Kang |
| 2016/0087035 A1* | 3/2016 | Kim .................... H01L 29/4966 257/368 |
| 2016/0172488 A1 | 6/2016 | Oh et al. |
| 2016/0284640 A1 | 9/2016 | Wang et al. |
| 2016/0372586 A1 | 12/2016 | Fujii et al. |

FOREIGN PATENT DOCUMENTS

| | | |
|---|---|---|
| JP | 2015079865 A | 4/2015 |
| KR | 20110003048 A | 1/2011 |
| KR | 20150015181 A | 2/2015 |
| KR | 20160034494 A | 3/2016 |
| WO | 9900838 A1 | 1/1999 |

\* cited by examiner

SEMICONDUCTOR MEMORY DEVICES

CROSS-REFERENCE TO RELATED APPLICATIONS

This U.S. non-provisional patent application is a continuation of and claims priority from U.S. application Ser. No. 16/820,006, now U.S. Pat. No. 10,991,699, filed on Mar. 16, 2020, which is a continuation of and claims priority from U.S. application Ser. No. 15/952,308, now U.S. Pat. No. 10,615,164, filed on Apr. 13, 2018, which claims priority under 35 U.S.C. § 119 to Korean Patent Application No. 10-2017-0101835, filed on Aug. 10, 2017, in the Korean Intellectual Property Office, the entire contents of each are hereby incorporated herein by reference.

BACKGROUND

The present disclosure relates to semiconductor memory devices. Due to their small-size, multifunctional, and/or low-cost characteristics, semiconductor devices are considered important elements in the electronics industry. Higher integration of semiconductor devices, such as semiconductor memory devices, may be beneficial to satisfy consumer demands for superior performance and inexpensive prices. In the case of semiconductor memory devices, increased integration may be especially beneficial, because their integration may be an important factor in determining product prices. However, the extremely expensive process equipment used to increase pattern fineness may set a practical limitation on increasing integration for semiconductor memory devices. To overcome such a limitation, a variety of studies on new technology for increasing integration density of a semiconductor device have been conducted.

SUMMARY

Some embodiments of the inventive concepts provide a semiconductor memory device with increased integration density and improved electric characteristics and a method of fabricating the same.

According to some embodiments of the inventive concepts, a semiconductor memory device may include a substrate. The semiconductor memory device may include a device isolation layer defining active regions of the substrate. The semiconductor memory device may include a gate line structure including a gate insulating layer and a gate electrode that are buried in a trench of the substrate to cross the active regions. The trench may include first trench portions on the device isolation layer and second trench portions on the active regions. Moreover, in the second trench portions, the gate insulating layer may overlap a top surface of the gate electrode.

According to some embodiments of the inventive concepts, a semiconductor memory device may include a substrate. The semiconductor memory device may include a device isolation layer defining active regions of the substrate. The semiconductor memory device may include a gate line structure buried in a trench in the substrate to cross the active regions. The gate line structure may include a gate insulating layer and a gate electrode in the trench. The gate electrode may include first electrode portions on the device isolation layer and second electrode portions on the active regions. Moreover, the second electrode portions may be wider than the first electrode portions.

According to some embodiments of the inventive concepts, a method of forming a semiconductor memory device includes forming a device isolation layer in a substrate to define active regions. The method may include forming a trench to cross the active regions. The trench may include first trench portions exposing the device isolation layer and second trench portions exposing the active regions. Moreover, the method may include sequentially forming a gate insulating layer and a gate electrode layer in the trench. Each of the second trench portions may include an upper trench and a lower trench that is wider than the upper trench. The sequentially forming may include forming the gate insulating layer in the upper trench to define gate regions in the lower trench. The sequentially forming may further include forming the gate electrode layer in the gate regions through the first trench portions.

A semiconductor memory device, according to some embodiments of the inventive concepts, may include a substrate including first and second trenches therein. The semiconductor memory device may include an isolation layer in the first trench. The semiconductor memory device may include a first gate electrode portion in the isolation layer in the first trench. Moreover, the semiconductor memory device may include a second gate electrode portion in the second trench. The second trench may be free of the isolation layer. The second gate electrode portion may be wider, in a direction, than the first gate electrode portion. An upper region of the second trench may be spaced apart from the first trench by a greater distance, in the direction, than a lower region of the second trench.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
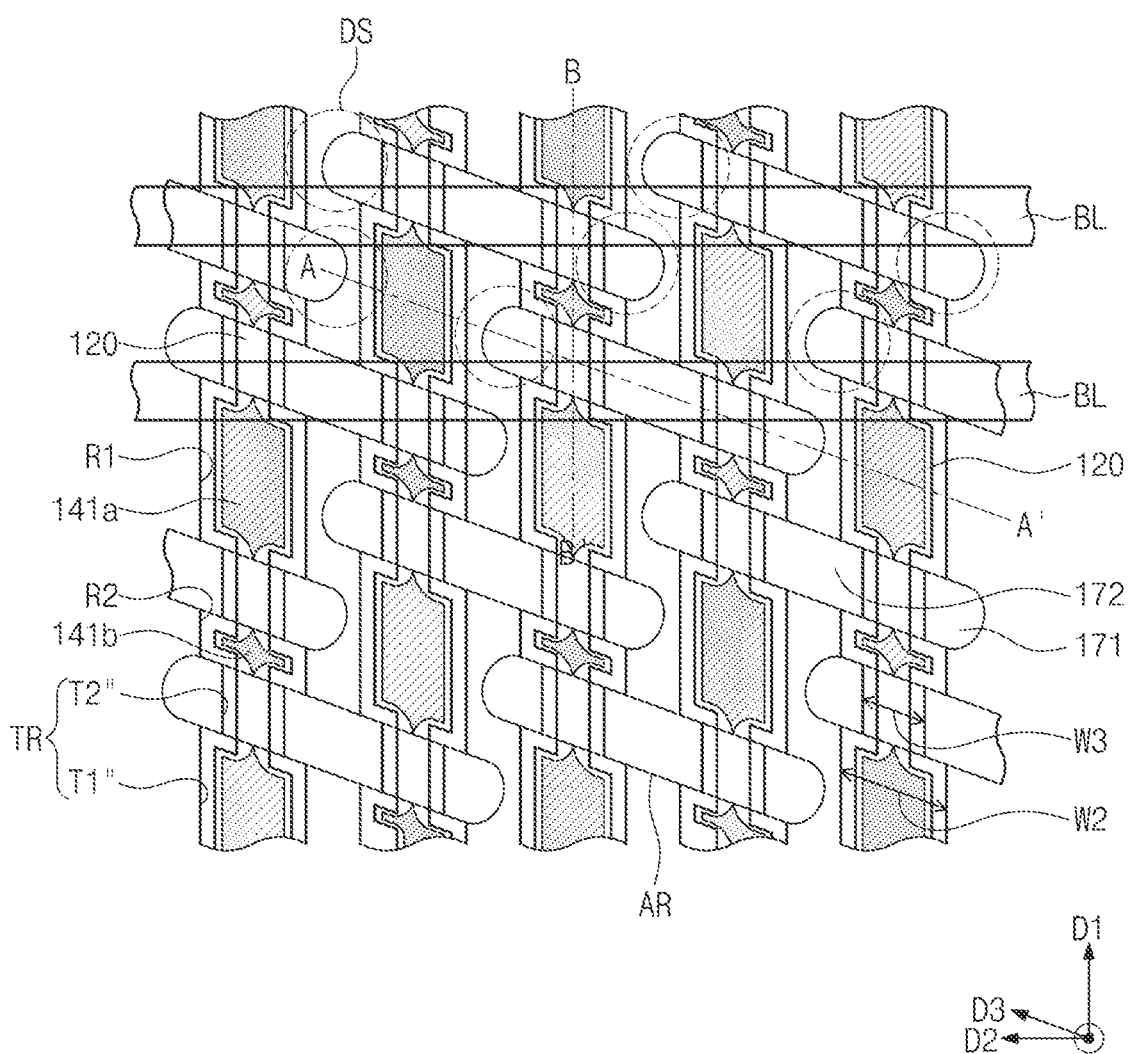
FIG. 1 is a plan view of a semiconductor memory device according to some embodiments of the inventive concepts.
Figure 2:
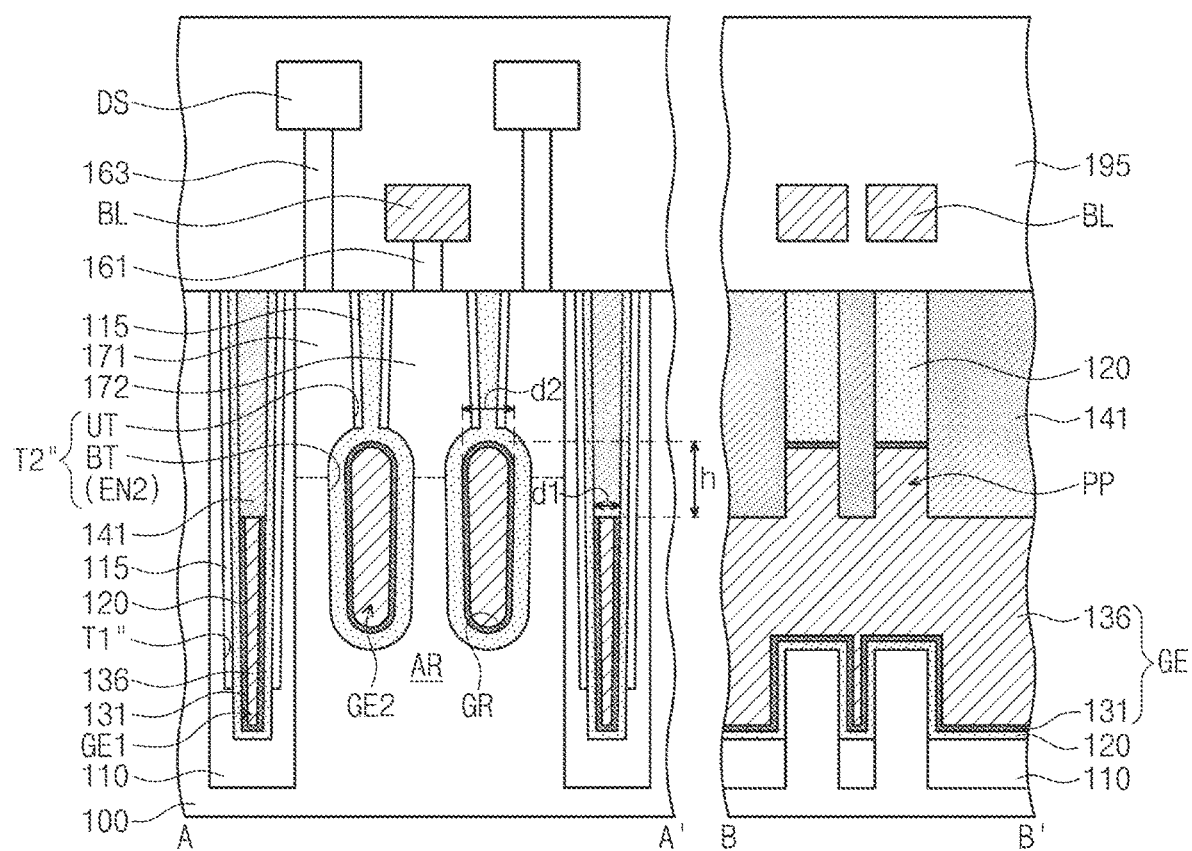
FIG. 2 is a sectional view illustrating cross-sections taken along lines A-A' and B-B' of FIG. 1.

FIG. 1 is a plan view of a semiconductor memory device according to some embodiments of the inventive concepts. FIG. 2 is a sectional view illustrating cross-sections taken along lines A-A' and B-B' of FIG. 1.

Referring to FIGS. 1 and 2, a substrate 100 may be provided to have active regions AR defined by a device isolation layer 110. For example, the substrate 100 may be a silicon wafer. The device isolation layer 110 may be formed of or include silicon oxide. The active regions AR may be spaced apart from each other in a horizontal direction, and each of the active regions AR may be a bar-shaped pattern extending in a third direction D3. A top surface of the substrate 100 may be parallel to a first direction D1 and a second direction D2, and the third direction D3 may intersect, but not be perpendicular to, both of the first and second directions D1, D2.

A plurality of trenches TR may be provided in an upper region of the substrate 100, and gate line structures may be provided in the trenches TR to cross the active regions AR. As used herein, the term "gate line structure" may refer to a structure that includes a gate insulating layer 120 and a gate electrode GE (FIG. 2). The trenches TR may be spaced apart from each other in the second direction D2. As an example, each of the active regions AR may be provided to cross a pair of the trenches TR. Each of the trenches TR may extend in the first direction D1 to alternately cross the device isolation layer 110 and the active regions AR. Hereinafter, some embodiments of the inventive concepts will be described with reference to one of the trenches TR.

As an example, the trench TR may include first trench portions T1" on/in the device isolation layer 110 and second trench portions T2" on/in the active regions AR. The second trench portions T2" may be free of (i.e., may not include therein) the device isolation layer 110. The first trench portions T1" and the second trench portions T2" may be alternately arranged in the first direction D1. When measured in the third direction D3, the first trench portions T1" may have a width W2 larger than a width W3 of the second trench portions T2". As an example, the width W2 of the first trench portions T1" may be larger by about 10% to 90% than the width W3 of the second trench portions T2". The widths W2 and W3 may refer to upper (e.g., uppermost) widths of the trench portions T1" and T2".

The first trench portions T1" may include a first region R1 having a large width and a second region R2 having a small width in the first direction D1, as shown in FIG. 1. When measured in the first direction D1, the width of the first region R1 may be about 2-10 times that of the second region R2. The first region R1 and the second region R2 may be alternately arranged in the first direction D1. The second trench portions T2" may be provided between ones of the first region R1 and the second region R2 that are adjacent to each other. In other words, the first region R1, the second trench portions T2", the second region R2, and the second trench portions T2" may be sequentially arranged in the first direction D1 in the enumerated order.

The first trench portions T1" may have bottom surfaces lower than those of the second trench portions T2". As an example, the bottom surfaces of the first trench portions T1" may be lower by about 150 Å to about 550 Å than those of the second trench portions T2". Each of the second trench portions T2" may include an upper trench UT, which is provided to have a relatively small width, and a lower trench BT, which is extended from the upper trench UT and has a width larger than that of the upper trench UT. The second trench portions T2" (e.g., the lower trench BT thereof) may include an expanded region EN2, which is extended from the upper trench UT and is expanded in horizontal and/or vertical directions to have a width larger than the upper trench UT. The expanded region EN2 is illustrated to have a vertical length larger than a horizontal length or to have an ellipse shape, but the inventive concepts are not limited thereto. For example, in some embodiments, the shape of the expanded region EN2 may be variously changed.

A gate insulating layer 120 may be provided in the trench TR. In the first trench portions T1", the gate insulating layer 120 may be provided to conformally cover side and bottom surfaces of the first trench portions T1". In the second trench portions T2", the gate insulating layer 120 may be provided to fill the upper trench UT and thereby to define empty spaces (hereinafter, gate regions GR) in the lower trench BT. Each of the gate regions GR may have a top portion closed by the gate insulating layer 120 and may be connected to ones of the first trench portions T1" that are horizontally located adjacent thereto. The gate insulating layer 120 may be formed of or include at least one of silicon oxide, silicon nitride, or silicon oxynitride. As an example, the gate insulating layer 120 may be a silicon oxide layer.

A gate electrode GE may be provided on the gate insulating layer 120. The gate electrode GE may include a barrier electrode layer 131 and a metal electrode layer 136. The barrier electrode layer 131 may be formed of or include at least one of conductive metal nitrides (e.g., tantalum nitride (TaN), titanium nitride (TiN), or tungsten nitride (WN)). The metal electrode layer 136 may be a metal layer (e.g., of tungsten (W), titanium (Ti), or tantalum (Ta)). The gate electrode GE may include first electrode portions GE1 in the first trench portions T1" and second electrode portions GE2 in the second trench portions T2".

The first electrode portions GE1 may be provided in lower portions of the first trench portions T1", and top surfaces of the first electrode portions GE1 may be overlapped (e.g., covered) with capping insulating patterns 141 occupying upper regions of the first trench portions T1". The second electrode portions GE2 may be provided to fill the gate regions GR of the second trench portions T2". Top surfaces of the second electrode portions GE2 may be overlapped (e.g., covered) with the gate insulating layer 120 filling the upper trench UT. Due to rounded surfaces of the gate regions GR, the top surfaces of the second electrode portions GE2 may also have a rounded shape. In some embodiments, each of the first electrode portions GE1 may have a substantially flat top surface.

At upper regions of the first electrode portions GE1, the barrier electrode layer 131 may expose a top surface of the metal electrode layer 136. The capping insulating patterns 141 may be connected to the exposed top surface of the metal electrode layer 136. In some embodiments, at upper regions of the second electrode portions GE2, the metal electrode layer 136 may be overlapped (e.g., covered) with the barrier electrode layer 131. In other words, the top surface of the metal electrode layer 136 may be spaced apart from the gate insulating layer 120 with the barrier electrode layer 131 interposed therebetween. As an example, in the second electrode portions GE2, the barrier electrode layer 131 may have a ring-shaped section, and in the first electrode portions GE1, the barrier electrode layer 131 may have a 'U'-shaped section.

The second electrode portions GE2 may include protruding portions PP, which protrude in a direction from top surfaces of the first electrode portions GE1 toward a top surface of the substrate 100. That is, top surfaces of the second electrode portions GE2 may be higher by a height h than those of the first electrode portions GE1. In some embodiments, the height h may be greater than a thickness of the gate insulating layer 120. In some embodiments, the height h may range from about 100 Å to about 500 Å.

When measured in the third direction D3, a width d2 of the second electrode portions GE2 may be larger than a width d1 of the first electrode portions GE1. For example, the width d2 of the second electrode portions GE2 may be about 1.1 to 3 times the width d1 of the first electrode portions GE1. Bottom surfaces of the first electrode portions GE1 may be lower than those of the second electrode portions GE2.

A spacer 115 may be provided between a side surface of the trench TR and the gate insulating layer 120. In the first trench portions T1", the spacer 115 may be provided along side surfaces of the first electrode portions GE1. That is, in the first trench portions T1", the spacer 115 may be horizontally spaced apart from the first electrode portions GE1 by the gate insulating layer 120. In the second trench portions T2", a bottom surface of the spacer 115 may be vertically spaced apart from bottom surfaces of the second electrode portions GE2 by the gate insulating layer 120. The spacer 115 may be provided on a side surface of the upper trench UT and may not be extended to the lower trench BT. In some embodiments, the spacer 115 may be formed of or include at least one of silicon oxide, silicon oxynitride, or silicon nitride.

The capping insulating patterns 141 may be provided on the device isolation layers 110 and may not be provided on the active regions AR. The upper trenches UT of the second trench portions T2" may be occupied by the gate insulating layer 120, and the capping insulating patterns 141 may not be provided in the upper trenches UT. Accordingly, the active regions AR may be free of the capping insulating patterns 141. The capping insulating patterns 141 may include first capping insulating patterns 141a on the first regions R1 and second capping insulating patterns 141b on the second regions R2. When measured in the first direction D1, widths of the first capping insulating patterns 141a may be larger than those of the second capping insulating patterns 141b. The capping insulating patterns 141 may be formed of or include silicon nitride or silicon oxynitride.

First impurity regions 171 and second impurity regions 172 may be provided in the active regions AR. The first impurity regions 171 and the second impurity regions 172 may be spaced apart from each other with the trenches TR interposed therebetween. As an example, the first impurity regions 171 may be provided in both/opposing end portions of each of the active regions AR, and the second impurity region 172 may be provided between a pair of the first impurity regions 171. The impurity regions 171 and 172 may be doped to have a conductivity type different from that of the substrate 100.

Bit lines BL and data storages (e.g., data storage elements/structures) DS may be formed on the gate line structures. For convenience in illustration, the bit lines BL and the data storages DS may be partly illustrated in FIG. 1. The bit lines BL may extend in the second direction D2 and may be connected to a plurality of the second impurity regions 172 through first contacts 161. The data storages DS may be connected to the first impurity regions 171 through second contacts 163. Each of the bit lines BL and the first and second contacts 161 and 163 may be formed of or include at least one of metals, conductive metal nitrides, or semiconductor materials.

In the case where the memory device is a DRAM device, each of the data storages DS may be a capacitor including a lower electrode, a dielectric layer, and an upper electrode. In some embodiments, each data storage DS may include a phase-change layer, a variable-resistance layer, or a magnetic tunnel junction layer. An interlayer insulating layer 195 may be provided to overlap (e.g., cover) the data storages DS. In some embodiments, the interlayer insulating layer 195 may be formed of or include silicon oxide.

According to some embodiments of the inventive concepts, shapes, heights, and widths of the first and second electrode portions GE1 and GE2 may be variously changed. In some embodiments, each of the second electrode portions GE2 may be used as an access word-line for applying a voltage to the active regions AR. In some embodiments, the first electrode portions GE1 may be regions, which are buried in the device isolation layer 110 and are used as a passing word-line, and may not be used to directly apply a voltage to the active regions AR.

To increase an integration density of a semiconductor device, a width of a gate electrode may be reduced. However, to allow a transistor to have desired electric characteristics, it may be advantageous/necessary to maintain a thickness of a gate insulating layer within a specific thickness range. In addition, reduction in width of a gate electrode may lead to an increase in electrical resistance of the gate electrode, and thus, it may be difficult to reduce a size of the gate electrode. In some embodiments, the second electrode portions GE2 for applying a voltage to the active regions AR may be formed to have a width (e.g., in the third direction D3) larger than a width of the first electrode portions GE1 buried in the device isolation layer 110, and this may make it possible to secure an integration density of a semiconductor device and electric characteristics of transistors. Furthermore, widths of the active regions AR (in particular, the first and second impurity regions 171 and 172) between the gate electrodes may be increased, and thus, a current passing therethrough may also be increased.

In the case where the first electrode portions GE1 are relatively close to the first impurity region 171, a leakage current of a semiconductor device may be increased. In some embodiments, the first electrode portions GE1 may be formed to have top surfaces lower than those of the second electrode portions GE2, and this may make it possible to reduce a leakage current and thus to improve electric characteristics of a semiconductor device.

FIGS. 3 to 11 are sectional views, which are provided to describe a method of fabricating a semiconductor memory device according to some embodiments of the inventive concepts, and each of which illustrate cross-sections taken along lines A-A' and B-B' of FIG. 1.

Figure 3:
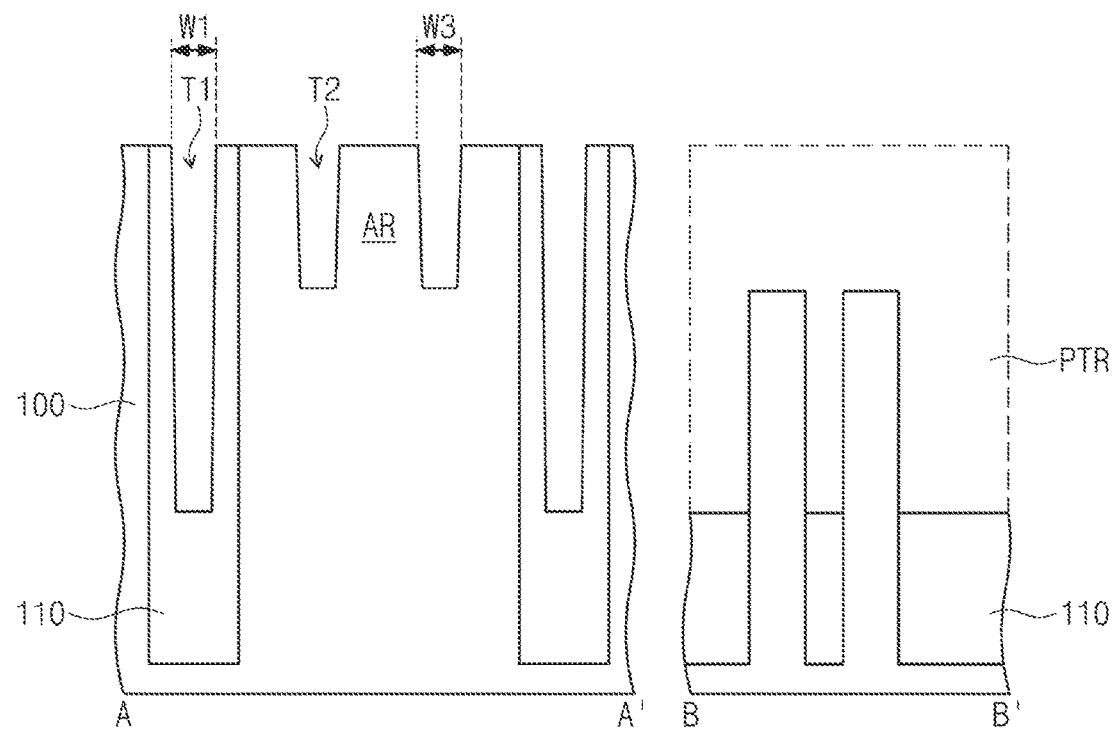
FIGS. 3 to 11 are sectional views, which are provided to describe a method of fabricating a semiconductor memory device according to some embodiments of the inventive concepts, and each of which illustrates cross-sections taken along lines A-A' and B-B' of FIG. 1.

Referring to FIGS. 1 and 3, a device isolation layer 110 may be formed in a substrate 100 to define active regions AR. The device isolation layer 110 may be formed of or include, for example, silicon oxide. An etching process may be performed on an upper portion of the substrate 100 to form preliminary trenches PTR crossing the active regions AR or extending in the first direction D1. Each of the preliminary trenches PTR, which are formed by the etching process, may have a position-dependent depth. For example, the preliminary trench PTR may include first trench portions T1 exposing the device isolation layer 110 and second trench portions T2 exposing the active regions AR. The first trench portions T1 may be formed in the substrate 100 to have a depth larger (i.e., deeper) than the second trench portions T2. When measured in the third direction D3, a first width W1 of the first trench portions T1 may be equal to a width W3 of the second trench portions T2, but in some embodiments, the first width W1 may be larger than the width W3 of the second trench portions T2. The etching process may be or include a dry etching process.

Figure 4:
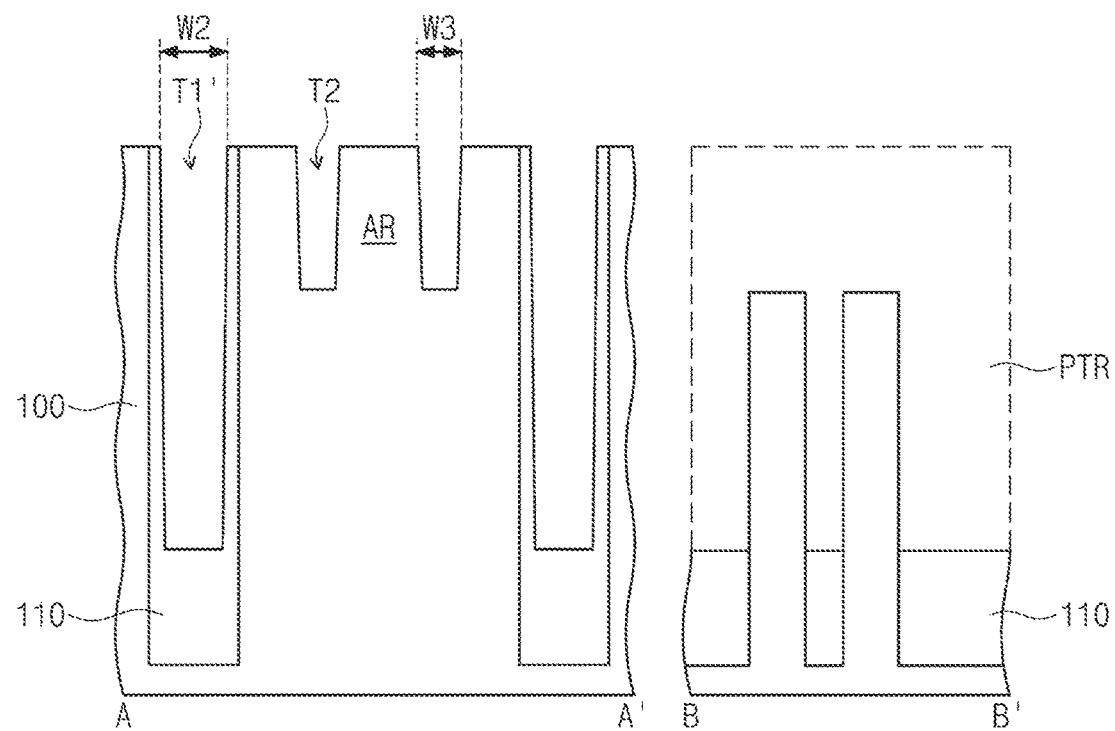

Referring to FIGS. 1 and 4, a selective etching process may be performed on the device isolation layer 110 defining the first trench portions T1 to form first trench portions T1' having an expanded structure. As an example, the selective etching process may be performed using an etch recipe capable of etching the device isolation layer 110 while suppressing the etching of the active region AR. When measured in the third direction D3, the first trench portions T1' may have a second width W2 larger than the first width W1 (and larger than the third width W3). The depth of the first trench portions T1' may also be increased. By contrast, the width W3 and depth of the second trench portions T2 may not be increased or may be increased at a relatively low rate.

Figure 5:
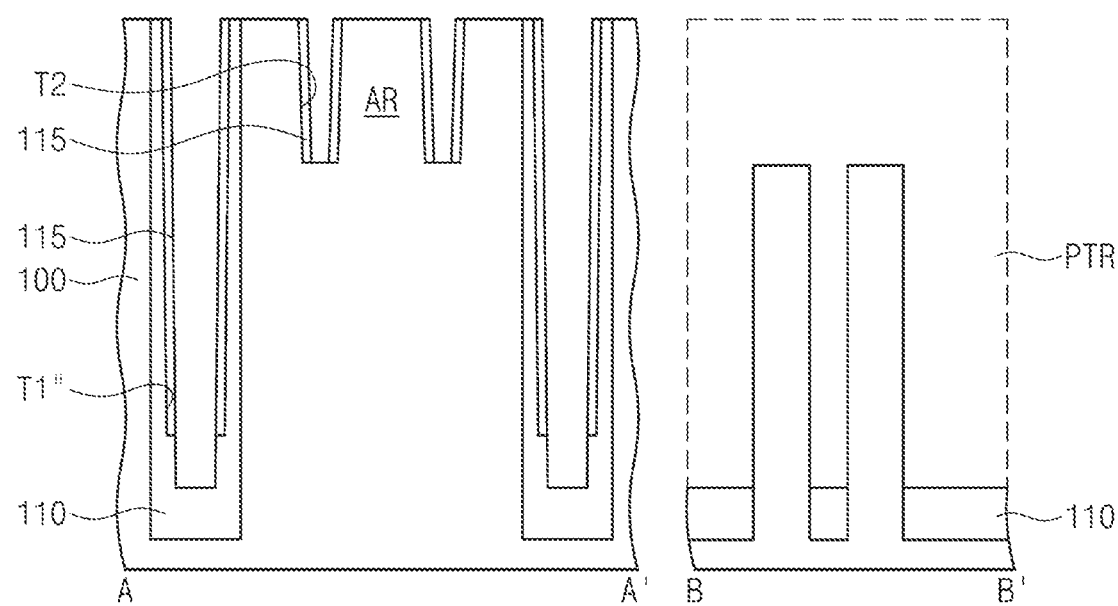

Referring to FIGS. 1 and 5, spacers 115 may be formed on inner sidewalls of the preliminary trenches PTR. The formation of the spacers 115 may include forming a spacer layer to cover the preliminary trenches PTR and performing an anisotropic etching process on the spacer layer. In some embodiments, the spacers 115 may be formed of or include at least one of silicon oxide, silicon oxynitride, or silicon nitride.

The device isolation layer 110 exposed by the spacers 115 may be further etched, and as a result, the first trench portions T1' having an increased depth (hereinafter, first trench portions T1") may be formed. The etching of the device isolation layer 110 may be performed during or directly after the formation of the spacers 115.

Figure 6:
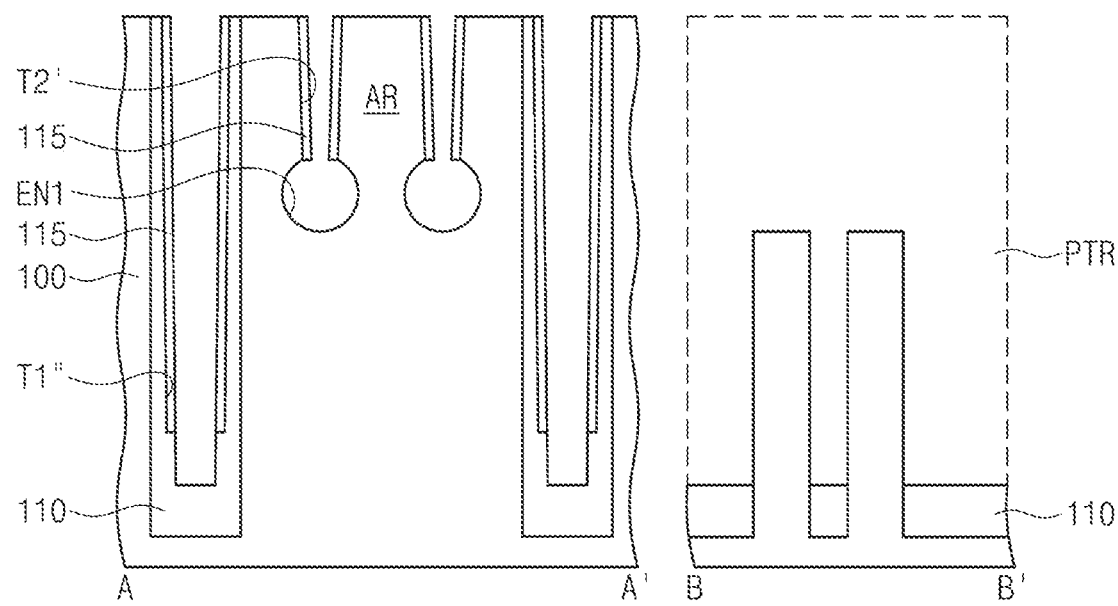

Referring to FIGS. 1 and 6, first expanded regions EN1 may be formed by etching portions of the active region AR exposed by the spacers 115 or located below the second trench portions T2. Hereinafter, the second trench portions T2' will be described to include the first expanded regions EN1. The formation of the first expanded regions EN1 may include performing an isotropic etching process on the active region AR exposed by the spacers 115. The first expanded regions EN1 may be formed by an etching process using an etching solution containing phosphoric acid or hydrofluoric acid. As shown, the first expanded regions EN1 may have a circular section, but the inventive concepts are not limited thereto. During the formation of the first expanded regions EN1, the device isolation layer 110 exposed by the first trench portions T1" may not be etched or may be etched at a relatively low rate.

Figure 7:
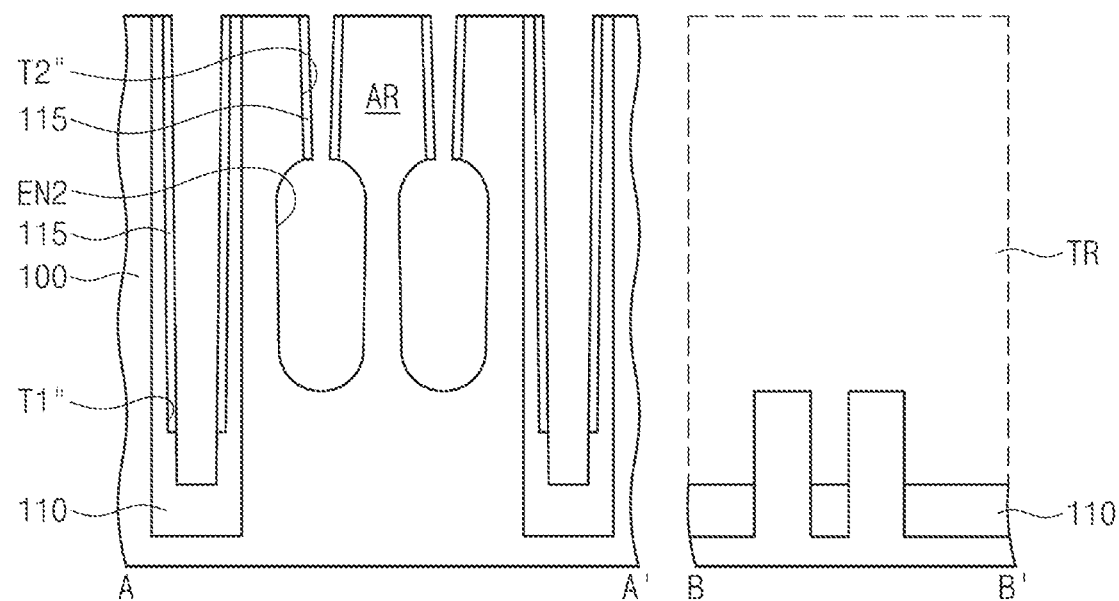

Referring to FIGS. 1 and 7, the first expanded regions EN1 may be expanded to form second expanded regions EN2. The second expanded regions EN2 may have a vertically extended shape, compared with the first expanded regions EN1. For example, the second expanded regions EN2 may have an elliptical section whose lateral width is smaller than its vertical width, but the inventive concepts are not limited thereto. The second expanded regions EN2 may be formed by performing an additional anisotropic etching process on the active region AR. As an example, the anisotropic etching process may be a dry etching process. Hereinafter, the second trench portions T2" will be described to include the the second expanded regions EN2. In addition, the trenches TR will be described to include the first trench portions T1" and the second trench portions T2". The processes, which have been described with reference to FIGS. 6 and 7, may be exchanged with each other in terms of the process order. In other words, the anisotropic etching process may be followed by the isotropic etching process.

Figure 8:
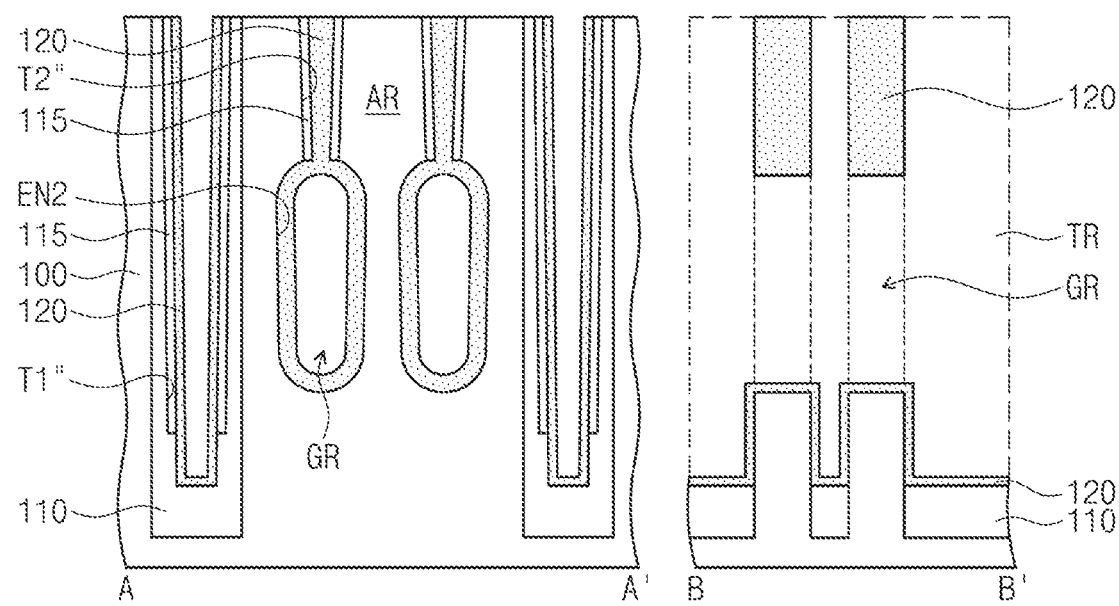

Referring to FIGS. 1 and 8, a gate insulating layer 120 may be formed on the resulting structure provided with the trenches TR. In the first trench portions T1", the gate insulating layer 120 may be formed to conformally cover side surfaces of the spacers 115 and a top surface of the device isolation layer 110. As an example, in the first trench portions T1", the gate insulating layer 120 may have a 'U'-shaped section.

The second trench portions T2" may include an upper trench having a first width and a lower trench (i.e., the second expanded region EN2) having a second width larger than the first width. The gate insulating layer 120 may be formed to fill the upper trench, and thus, gate regions GR may be formed in the lower trenches (i.e., the second expanded regions EN2). Each of the gate regions GR may have a top portion closed by the gate insulating layer 120 and may be connected to ones of the first trench portions T1" that are horizontally located adjacent thereto. The gate insulating layer 120 may be formed of or include at least one of silicon oxide, silicon nitride, or silicon oxynitride. As an example, the gate insulating layer 120 may be a silicon oxide layer. The gate insulating layer 120 may be formed by a chemical vapor deposition (CVD) or an atomic layer deposition (ALD).

Figure 9:
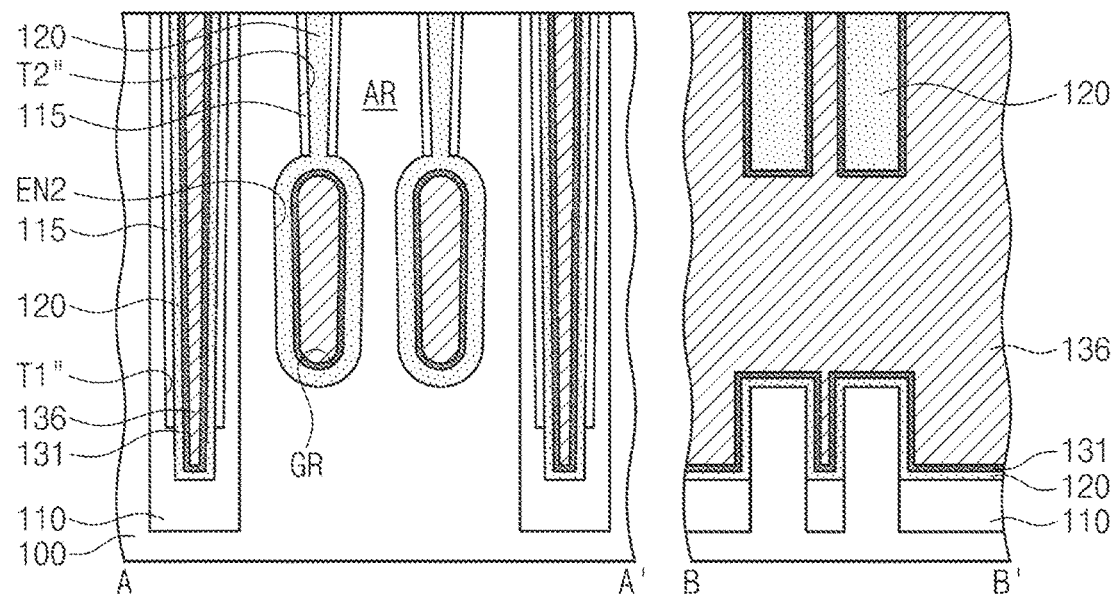

Referring to FIGS. 1 and 9, gate electrode layers may be formed in the trenches TR. For example, the gate electrode layers may include a barrier electrode layer 131 and a metal electrode layer 136 sequentially formed on the gate insulating layer 120. The barrier electrode layer 131 may be formed of or include at least one of conductive metal nitrides (e.g., TaN, TiN, or WN). The metal electrode layer 136 may be a metal layer (e.g., of W, Ti, or Ta). The gate electrode layers may be formed using at least one of a chemical vapor deposition (CVD), a physical vapor deposition (PVD), or an atomic layer deposition (ALD).

The gate electrode layers 131 and 136 may be formed in the gate regions GR through the first trench portions T1". For example, conductive materials may be supplied through the first trench portions T1" to fill the adjacent gate regions GR.

Figure 10:
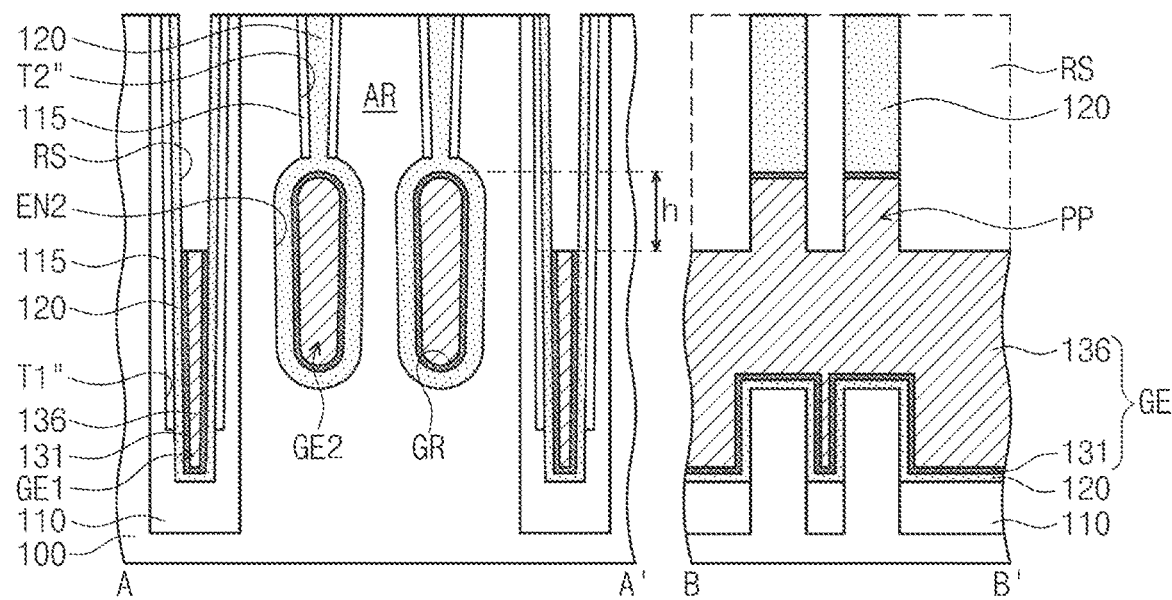

Referring to FIGS. 1 and 10, the gate electrode layers 131 and 136 may be partially etched. The gate electrode layers 131 and 136 in the first trench portions T1" may be removed to form recess regions RS, and as a result, gate electrodes GE may be formed. The formation of the recess regions RS may include performing an etch-back process on the gate electrode layers 131 and 136. Upper portions of the gate electrode layers 131 and 136 in the second trench portions T2" (in particular, the gate regions GR) may be overlapped (e.g., covered) with the gate insulating layer 120 and may not be etched during the etching process, and thus, the upper portions of the gate electrode layers 131 and 136 may remain in the second trench portions T2". The barrier electrode layer 131 and the metal electrode layer 136 may be simultaneously etched or may be sequentially etched by different etchants.

As a result of the local etching of the gate electrode layers 131 and 136, each of the gate electrodes GE may include protruding portions PP that are formed on a top surface thereof. Each of the gate electrodes GE may include first electrode portions GE1 in the first trench portions T1" and second electrode portions GE2 in the second trench portions T2". Top surfaces of the second electrode portions GE2 may be higher by a height h than those of the first electrode portions GE1. In some embodiments, the height h may range from about 100 Å to about 500 Å.

Figure 11:
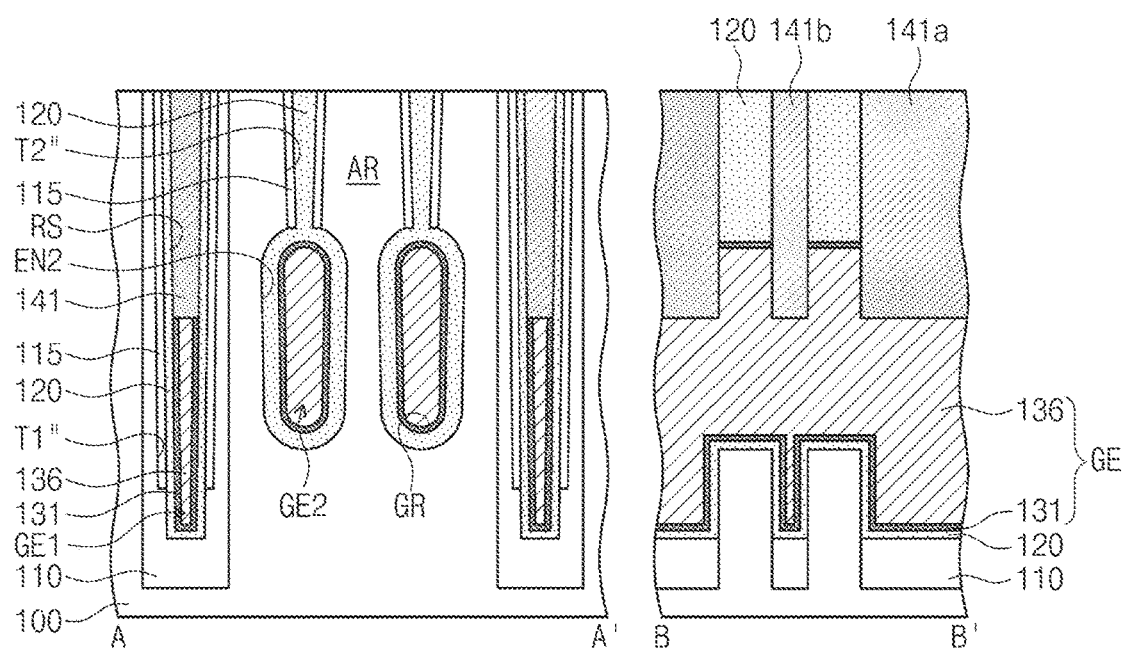

Referring to FIGS. 1 and 11, capping insulating patterns 141 may be formed to fill the recess regions RS. The capping insulating patterns 141 may not be formed in the second trench portions T2" and may be formed in the first trench portions T1". In other words, when viewed in a plan view, the capping insulating patterns 141 may not be formed on the active regions AR and may be locally formed on the device isolation layers 110.

As shown in FIG. 1, the capping insulating patterns 141 may include first capping insulating patterns 141a, which are formed on the first regions R1 where a distance between the active regions AR is relatively large, and second capping insulating patterns 141b, which are formed on the second regions R2 where the distance is relatively small. When measured in the first direction D1, widths of the first capping insulating patterns 141a may be larger than those of the second capping insulating patterns 141b.

The capping insulating patterns 141 may be formed of or include silicon nitride or silicon oxynitride. The formation of the capping insulating patterns 141 may include a chemical vapor deposition process. Thereafter, a planarization process may be performed to expose top surfaces of the active regions AR. Gate line structures may be formed in an upper region of the substrate 100 (e.g., through steps/operations of FIGS. 3 to 11). As an example, the gate line structures may include word lines. For example, the metal electrode layer 136 in the gate regions GR may provide word lines that are buried in the substrate 100.

Referring back to FIGS. 1 and 2, first impurity regions 171 and second impurity regions 172 may be formed in the active regions AR. For example, the first impurity regions 171 may be formed in both/opposing end portions of each of the active regions AR, and the second impurity region 172 may be formed between a pair of the first impurity regions 171. In some embodiments, the impurity regions 171 and 172 may be formed by injecting impurity ions, whose conductivity type is different from that of the substrate 100, into an upper portion of the substrate 100. Bottom surfaces of the impurity regions 171 and 172 may be lower than the top surfaces of the second electrode portions GE2 and may be higher than the top surfaces of the first electrode portions GE1. The inventive concepts are not limited to a method of forming the impurity regions 171 and 172 after forming the first and second gate electrode portions GE1, GE2. Rather, the impurity regions 171 and 172 may be formed at any step/operation of FIGS. 3 to 11.

Bit lines BL and data storages DS may be formed on the resulting structure provided with the gate line structures. The bit lines BL may extend in the second direction D2 and may be connected to a plurality of the second impurity regions 172 through first contacts 161. The data storages DS may be connected to the first impurity regions 171 through second contacts 163. Each of the bit lines BL and the first and second contacts 161 and 163 may be formed of or include at least one of metals, conductive metal nitrides, or semiconductor materials.

In some embodiments, each of the data storages DS may be a capacitor including a lower electrode, a dielectric layer, and an upper electrode. Next, an interlayer insulating layer 195 may be formed to cover the data storages DS. In some embodiments, the interlayer insulating layer 195 may be formed of or include silicon oxide.

According to some embodiments of the inventive concepts, it may be possible to secure a distance between the trenches TR, more specifically between upper portions of the trenches TR and increase a width of the gate electrode GE. In some devices where the width of a gate electrode is increased, active regions between the gate electrodes may have a reduced thickness, and in such cases, the active regions may be bent during a fabrication process. According to some embodiments of the inventive concepts, however, due to the second expanded regions EN2, it may be possible to secure the distance between the trenches TR and to increase the width of the gate electrode (e.g., the second gate electrode portions GE2), as shown in FIG. 7.

According to some embodiments of the inventive concepts, the protruding portions PP may be formed without an additional photolithography process. In other words, as described with reference to FIG. 10, during the etching process, upper portions of the gate electrode layers 131 and 136 in the gate regions GR in the second trench portions T2" may be protected by the gate insulating layer 120, and thus, upper portions of the gate electrode layers 131 and 136 in the first trench portions T1" may be selectively removed during the etching process. Accordingly, it may be possible to secure electric characteristics of a semiconductor device and to simplify a process of fabricating a semiconductor device.

Figure 12:
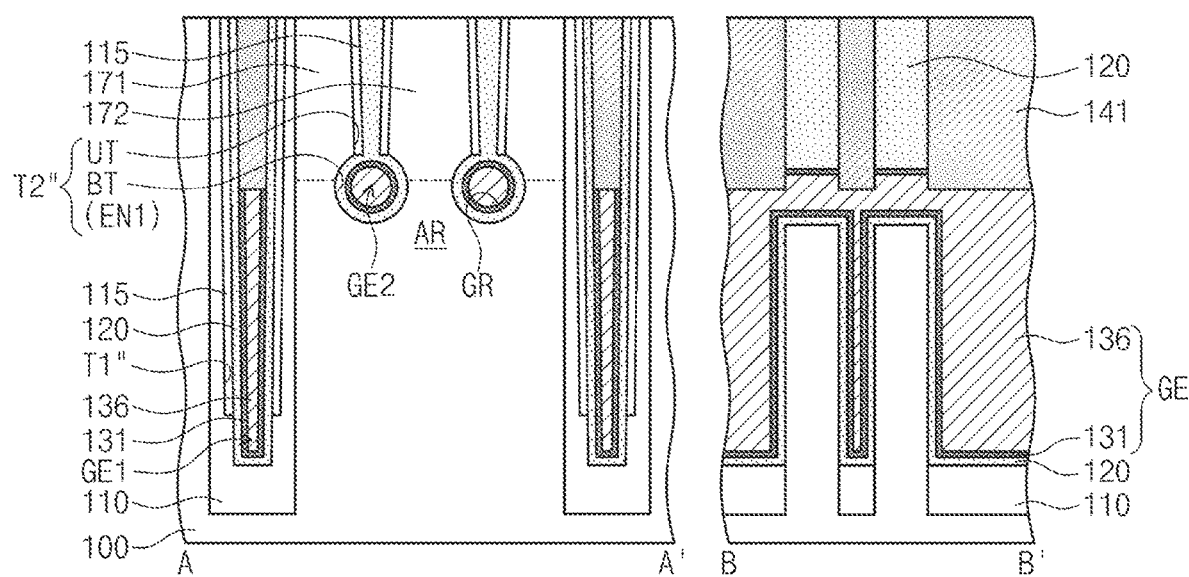
FIG. 12 is a sectional view illustrating a semiconductor memory device according to some embodiments of the inventive concepts.

FIG. 12 is a sectional view illustrating a semiconductor memory device according to some embodiments of the inventive concepts. For concise description, a previously described element may be identified by a similar or identical reference number without repeating an overlapping description thereof.

Referring to FIG. 12, a semiconductor memory device may be fabricated by processes of FIGS. 3 to 11, but without the process of FIG. 7. In other words, a semiconductor memory device according to some embodiments may be fabricated without the anisotropic etching process on the first expanded regions EN1. As a result, the second electrode portions GE2 in the first expanded regions EN1 may be formed to have a substantially circular section.

FIGS. 13 to 16 are sectional views illustrating a semiconductor memory device and a method of fabricating the same, according to some embodiments of the inventive concepts. For concise description, a previously described element may be identified by a similar or identical reference number without repeating an overlapping description thereof.

Figure 13:
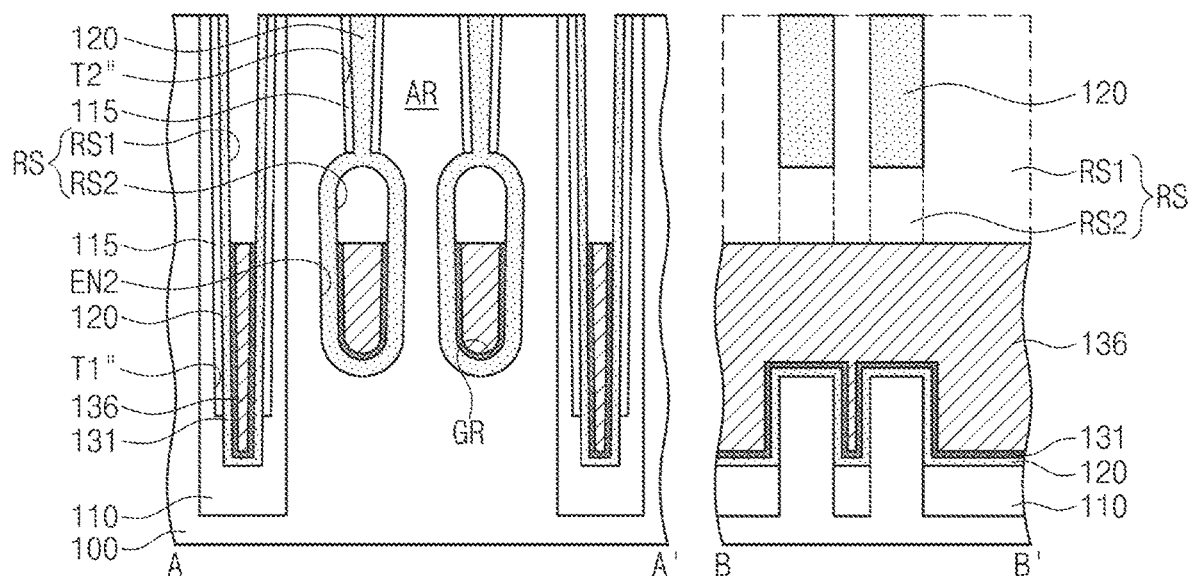
FIGS. 13 to 16 are sectional views illustrating a semiconductor memory device and a method of fabricating the same, according to some embodiments of the inventive concepts.

Referring to FIGS. 1 and 13, an etching process may be performed on the resulting structure described with reference to FIG. 10. As a result, the protruding portions PP described with reference to FIG. 10 may be removed. Recess regions RS may be expanded to include first recess regions RS1 in the first trench portions T1" and second recess regions RS2 in the gate regions GR. Bottom surfaces of the first and second recess regions RS1 and RS2 may be positioned at substantially the same height, but the inventive concepts are not limited thereto. For example, due to the spatial limitation of the gate regions GR, the bottom surfaces of the second recess regions RS2 may be formed at a level higher than the bottom surfaces of the first recess regions RS1. The etching process may be a process that is different from the etching process of FIG. 10, but in some embodiments, it may be a part of the etching process of FIG. 10 or may be continuously performed after the etching process of FIG. 10. As an example, the second recess regions RS2 may be formed by a method of increasing a process time of the etching process of FIG. 10 or a method of enhancing a cleaning process, which is performed as a part of the etching process.

Figure 14:
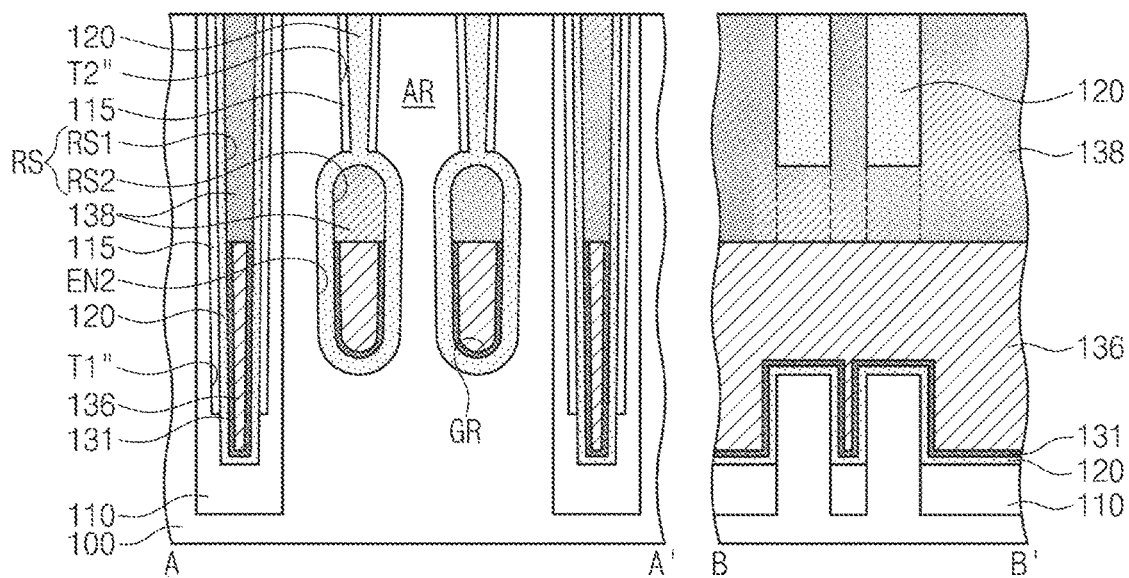

Referring to FIGS. 1 and 14, a semiconductor layer 138 may be formed to fill the first and second recess regions RS1 and RS2. The semiconductor layer 138 may include a doped poly silicon layer. In some embodiments, the semiconductor layer 138 may be doped with n-type impurities in an in-situ manner. The semiconductor layer 138 may be formed by a chemical vapor deposition process.

Figure 15:
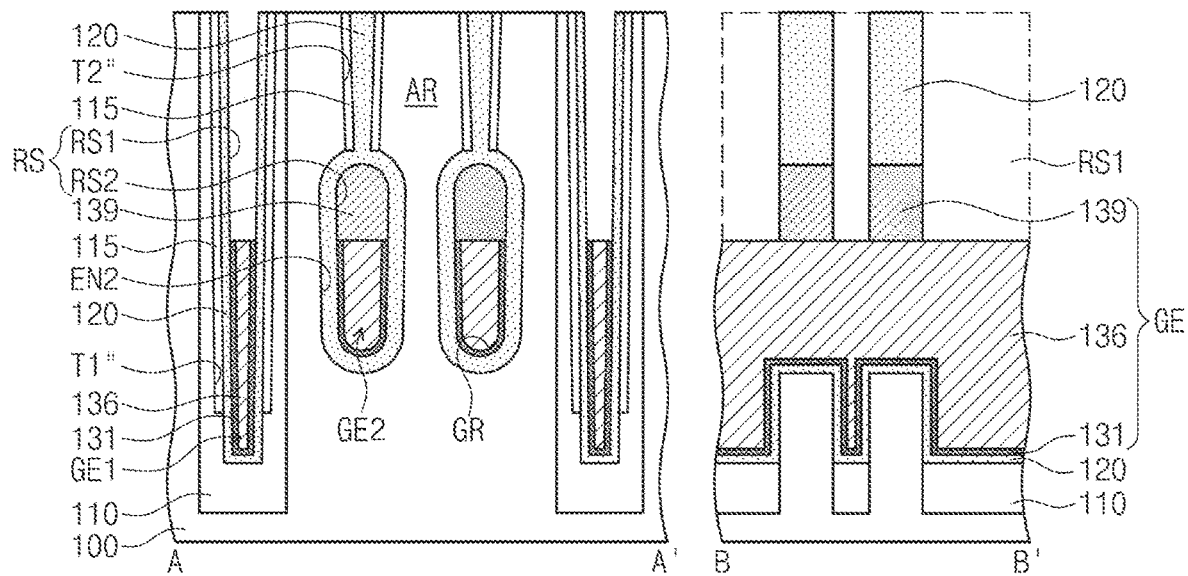

Referring to FIGS. 1 and 15, the semiconductor layer 138 may be removed from the first recess regions RS1 but may remain in the second recess regions RS2, thereby forming semiconductor patterns 139 in in the second recess regions RS2. An etch-back process may be performed to remove the semiconductor layer 138 from the first recess regions RS1. The semiconductor layer 138 in the second recess regions RS2 may be protected by the gate insulating layer 120 thereon and may not be removed from the second recess regions RS2. In the gate region GR, the semiconductor pattern 139 may be in contact with a top surface of the metal electrode layer 136. The semiconductor pattern 139, along with the barrier electrode layer 131 and the metal electrode layer 136, may constitute second electrode portions GE2. By contrast, first electrode portions GE1 may include the barrier electrode layer 131 and the metal electrode layer 136, but not the semiconductor pattern 139.

Figure 16:
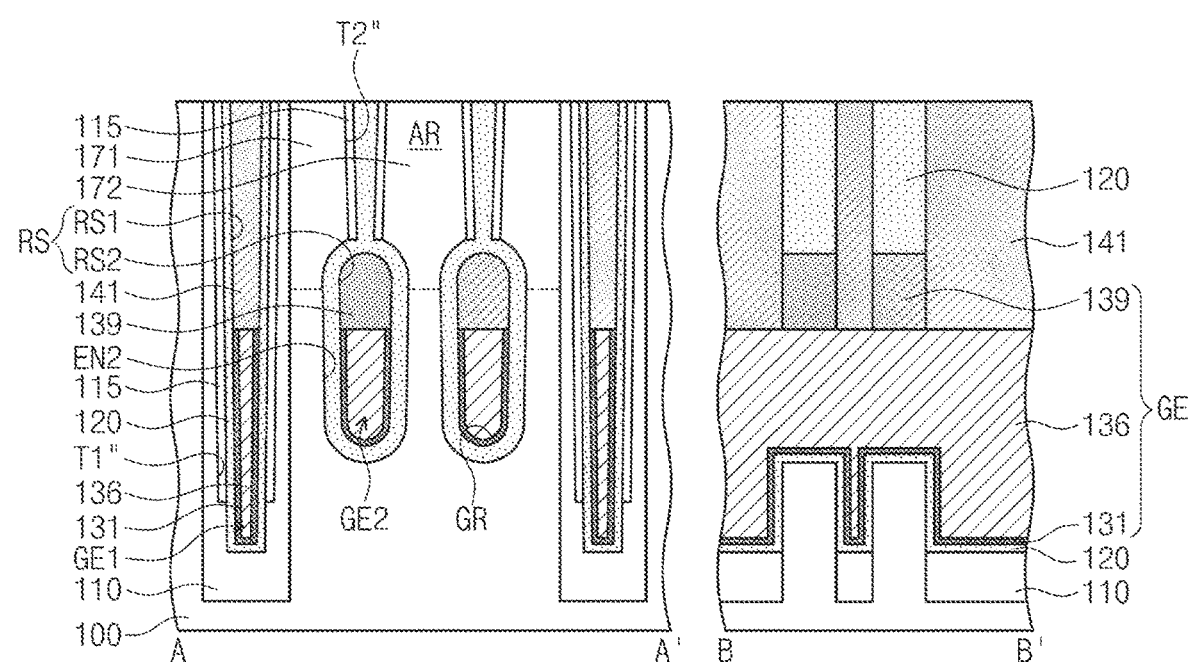

Referring to FIGS. 1 and 16, capping insulating patterns 141 may be formed to fill the first recess regions RS1. Thereafter, first and second impurity regions 171 and 172 may be formed.

Figure 17:
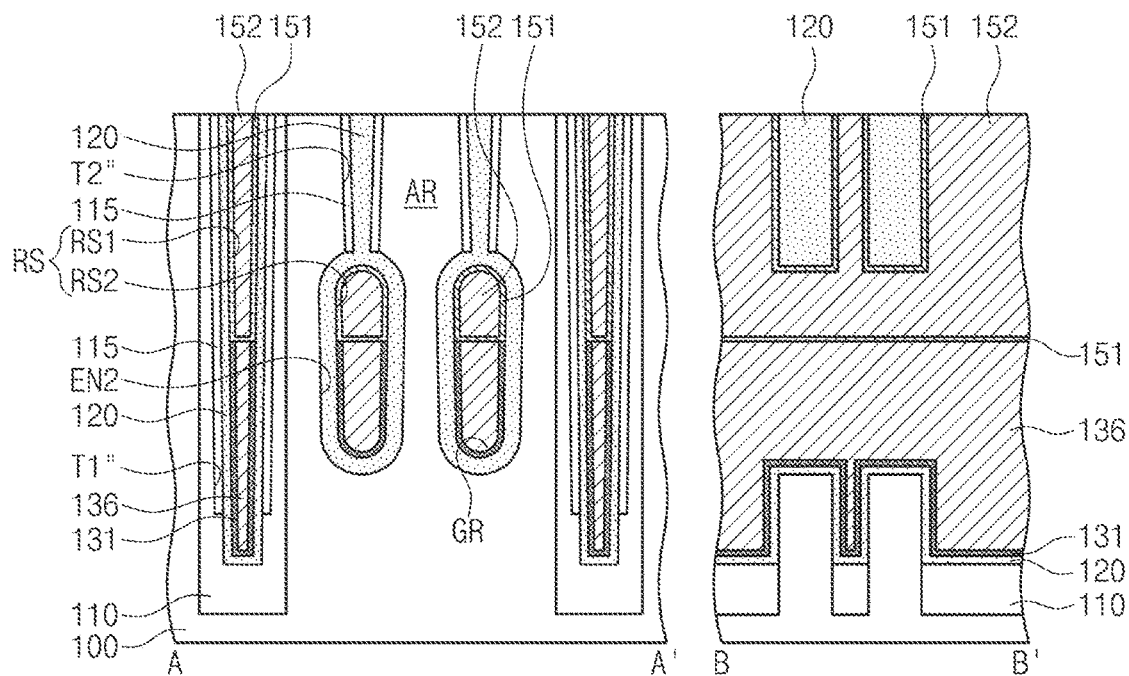
FIGS. 17 to 19 are sectional views illustrating a semiconductor memory device and a method of fabricating the same, according to some embodiments of the inventive concepts.
Figure 18:
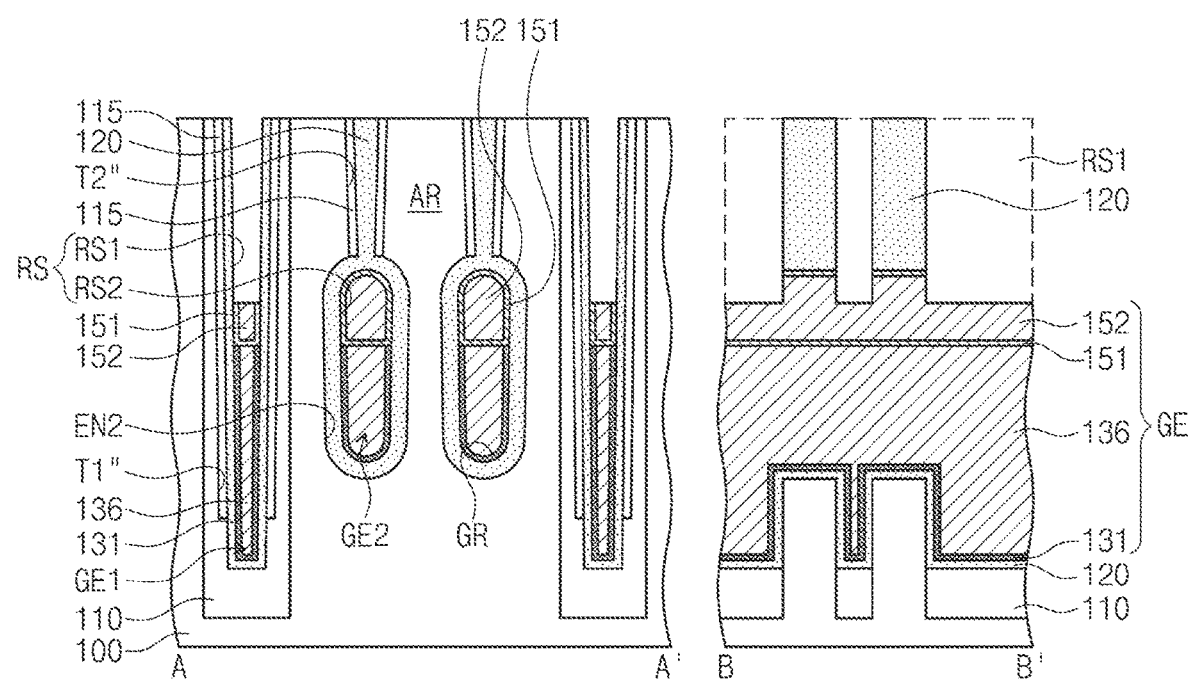
Figure 19:
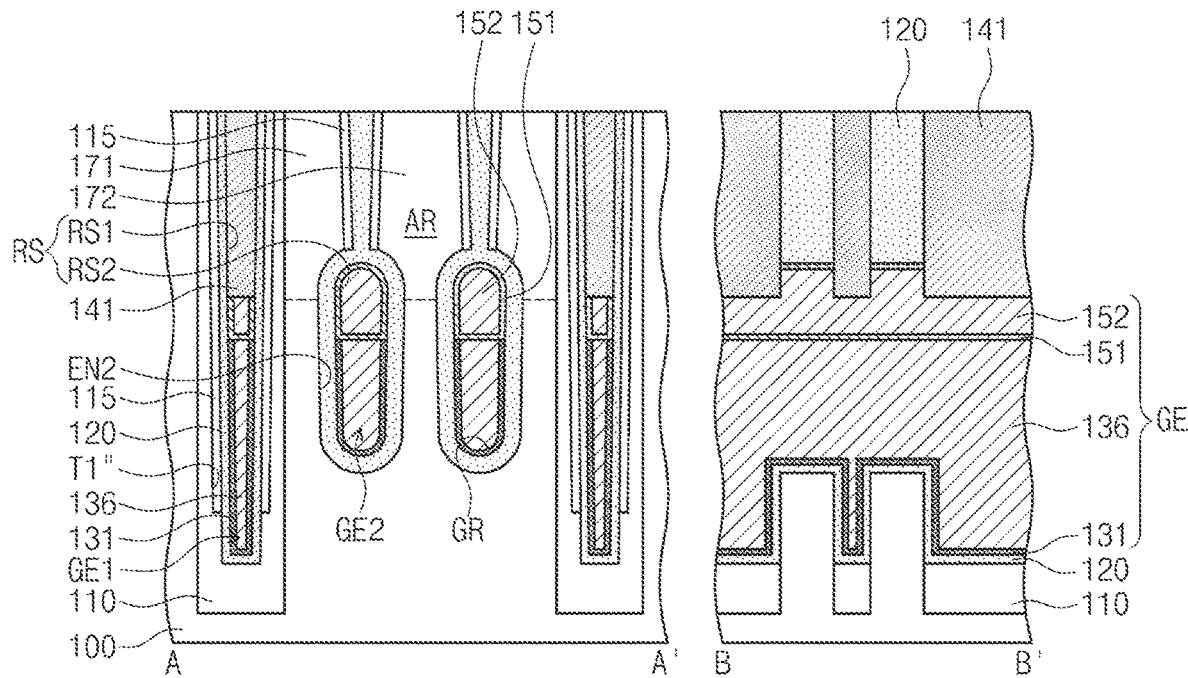

FIGS. 17 to 19 are sectional views illustrating a semiconductor memory device and a method of fabricating the same, according to some embodiments of the inventive concepts.

Referring to FIGS. 1 and 17, a work-function adjusting layer 151 and an upper metal electrode layer 152 may be formed on the resulting structure described with reference to FIG. 13. The combination of the work-function adjusting layer 151 and the upper metal electrode layer 152 may be formed of materials having a lower work-function than that of the combination of the barrier electrode layer 131 and the metal electrode layer 136 (which may be referred to hereinafter as a lower metal electrode layer). As an example, the work-function adjusting layer 151 may include a work-function adjusting material. The work-function adjusting material may include at least one of lanthanum (La), strontium (Sr), antimony (Sb), yttrium (Y), aluminum (Al), hafnium (Hf), or iridium (Ir).

The formation of the work-function adjusting layer 151 may include depositing a plurality of layers and performing a thermal treatment process thereon. For example, a lanthanum oxide layer and a titanium nitride layer may be sequentially deposited in the recess regions RS, and then, an annealing process may be performed at a temperature ranging from about 500° C. to about 1000° C. In some embodiments, an interface between the lanthanum oxide layer and the titanium nitride layer may be maintained. On the other hand, in some embodiments, as a result of counter diffusion of materials, there may be no interface between the lanthanum oxide layer and the titanium nitride layer. The upper metal electrode layer 152 may be formed of or include at least one of W, Ti, or Ta. For example, the upper metal electrode layer 152 may be formed of or include the same material as the lower metal electrode layer 136.

Referring to FIGS. 1 and 18, upper portions of the work-function adjusting layer 151 and the upper metal electrode layer 152 may be removed. The removal of the upper portions of the work-function adjusting layer 151 and the upper metal electrode layer 152 may include an etch-back process. The work-function adjusting layer 151 and the upper metal electrode layer 152 may be removed from the first recess regions RS1, whereas the work-function adjusting layer 151 and the upper metal electrode layer 152 in the second recess regions RS2 may be overlapped (e.g., covered) with the gate insulating layer 120 and thus may not be removed. In some embodiments, the work-function adjusting layer 151 and the upper metal electrode layer 152 may be completely removed from the first recess regions RS1. On the other hand, in some embodiments, a portion of them may remain in the first recess regions RS1.

In the first recess regions RS1, the work-function adjusting layer 151 may be provided to expose the upper metal electrode layer 152. For example, in the first recess regions RS1, the work-function adjusting layer 151 may have a 'U'-shaped section. By contrast, in the second recess regions RS2, the work-function adjusting layer 151 may be provided to overlap (e.g., cover) a top surface of the upper metal electrode layer 152. For example, in the second recess regions RS2, the work-function adjusting layer 151 may have a ring-shaped section. The work-function adjusting layer 151 may include a portion that is interposed between the upper metal electrode layer 152 and the lower metal electrode layer 136.

As a result of the afore-described process, gate electrodes GE may be formed to include the barrier electrode layer 131, the lower metal electrode layer 136, the work-function adjusting layer 151, and the upper metal electrode layer 152. The combination of the barrier electrode layer 131 and the lower metal electrode layer 136 may be an electrode portion having a relatively large work-function, and the combination of the work-function adjusting layer 151 and the upper metal electrode layer 152 may be an electrode portion having a relatively small work-function.

Referring to FIGS. 1 and 19, capping insulating patterns 141 may be formed to fill the first recess regions RS1. Thereafter, first and second impurity regions 171 and 172 may be formed.

Figure 20:
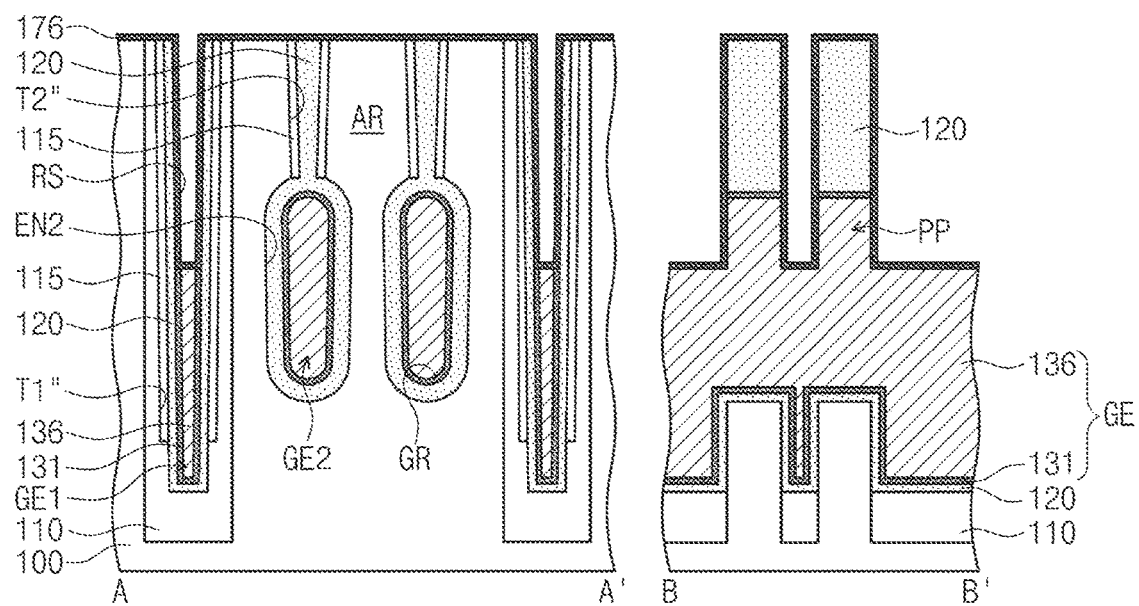
FIGS. 20 to 22 are sectional views illustrating a semiconductor memory device and a method of fabricating the same, according to some embodiments of the inventive concepts.
Figure 21:
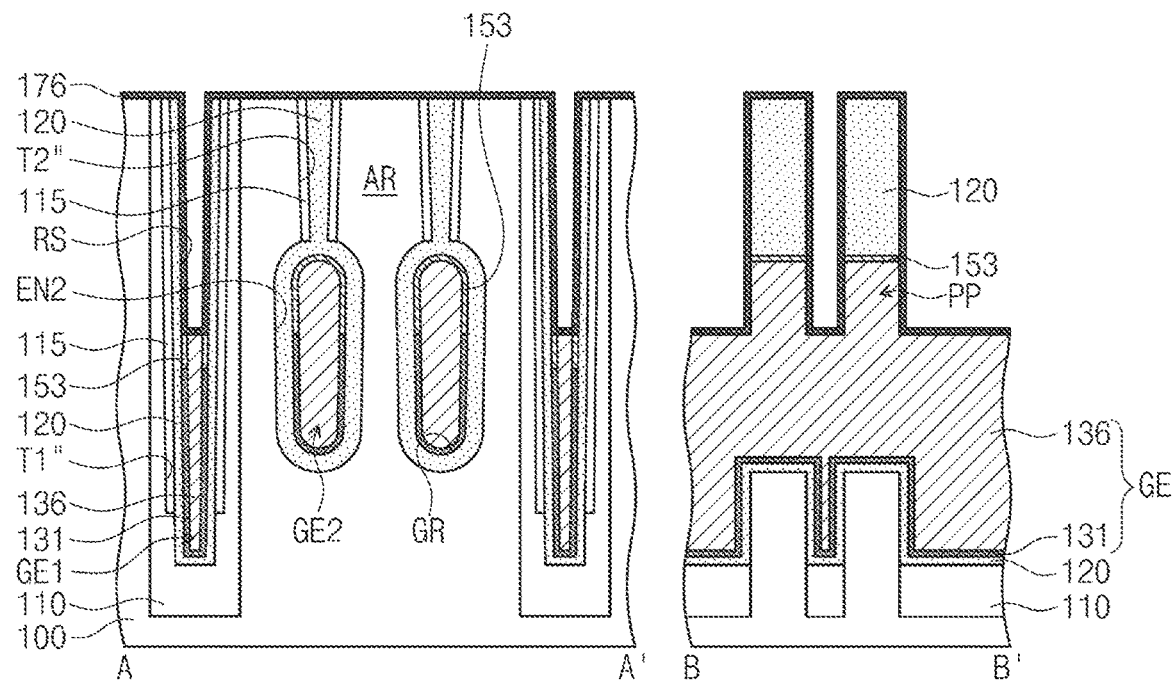
Figure 22:
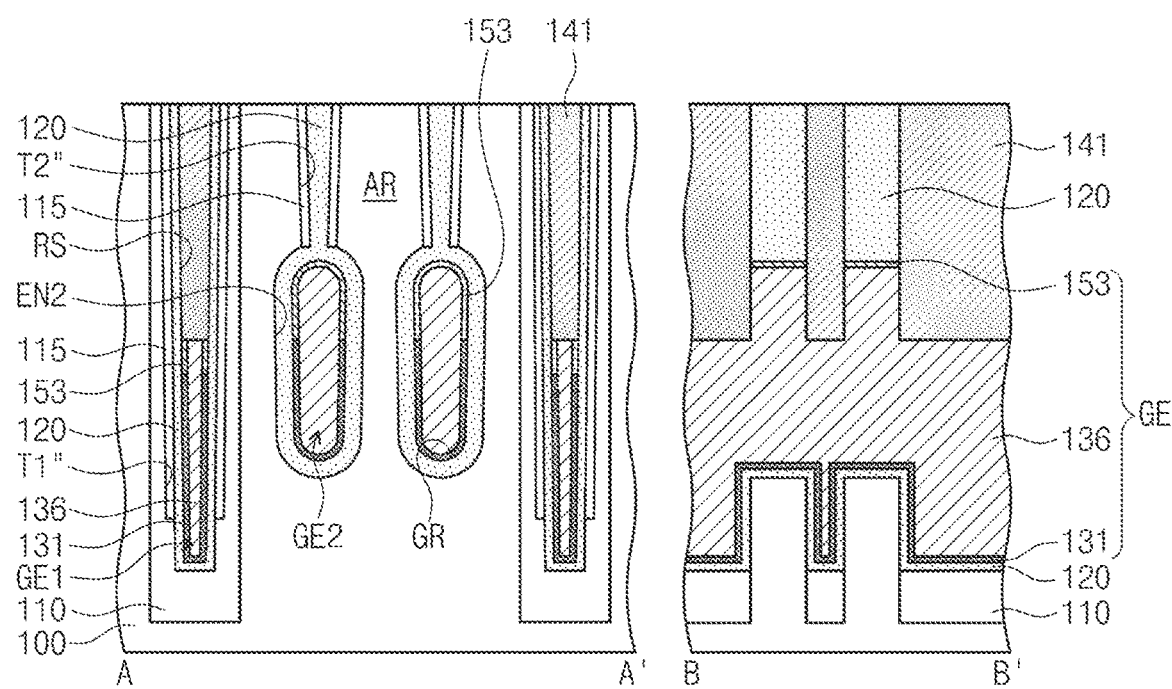

FIGS. 20 to 22 are sectional views illustrating a semiconductor memory device and a method of fabricating the same, according to some embodiments of the inventive concepts.

Referring to FIGS. 1 and 20, a metal oxide 176 may be formed on the resulting structure described with reference to FIG. 10. The metal oxide 176 may include a work-function adjusting material. The work-function adjusting material may include at least one of lanthanum (La), strontium (Sr), antimony (Sb), yttrium (Y), aluminum (Al), hafnium (Hf), or iridium (Ir). The metal oxide 176 may be formed to fill at least a portion of the recess regions RS and to be in contact with the barrier electrode layer 131 and the metal electrode layer 136.

Referring to FIGS. 1 and 21, a thermal treatment process may be performed, and thus, the work-function adjusting material in the metal oxide 176 may be diffused into the barrier electrode layer 131. The thermal treatment process may be performed at a temperature ranging from about 500° C. to about 1000° C. In the case where the metal oxide 176 is lanthanum oxide, lanthanum in the metal oxide 176 may be diffused into an upper portion of the barrier electrode layer 131 by the thermal treatment process. A portion of the barrier electrode layer 131 may be combined with the diffused lanthanum to form a work-function adjusting layer 153. In the case where the barrier electrode layer 131 is formed of titanium nitride, the work-function adjusting layer 153 may be a titanium-lanthanum nitride layer.

The work-function adjusting layer 153 may be locally formed on the barrier electrode layer 131. That is, the work-function adjusting material may be easily diffused into the barrier electrode layer 131 and may not be diffused into the metal electrode layer 136. In some embodiments, the work-function adjusting material may be diffused into the metal electrode layer 136 at a relatively low rate. The work-function adjusting material may be horizontally diffused, and in this case, the work-function adjusting layer 153 may also be formed in the upper portions of the barrier electrode layer 131 in the gate regions GR. A depth of the work-function adjusting layer 153 (or a position of a boundary between the work-function adjusting layer 153 and the barrier electrode layer 131) may be determined by adjusting process parameters (e.g., temperature and/or time) of the thermal treatment process.

Referring to FIGS. 1 and 22, after the thermal treatment process, the metal oxide 176 may be removed. Thereafter, capping insulating patterns 141 may be formed to fill the recess regions RS.

According to some embodiments of the inventive concepts, it may be possible to realize a semiconductor device with high integration density and improved electric characteristics. In addition, it may be possible to simplify a process of fabricating a semiconductor device.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor memory device comprising:
a substrate;
a device isolation layer defining active regions of the substrate; and
a gate line structure comprising a gate insulating layer and a gate electrode that are buried in a trench of the substrate to cross the active regions,
wherein the trench comprises first trench portions on the device isolation layer and second trench portions on the active regions,
wherein each of the second trench portions comprises an upper trench that has a first width and a lower trench that has a second width that is greater than the first width,
wherein a top surface of each of the first trench portions is located at a level closer than a top surface of the lower trench to a top surface of the substrate,
wherein the gate electrode comprises first electrode portions in the first trench portions and second electrode portions in the second trench portions, and
wherein each of the second electrode portions comprises a rounded top surface.

2. The semiconductor memory device of claim 1, wherein the rounded top surface of each of the second electrode portions is located at a level closer than flat top surfaces of the first electrode portions to the top surface of the substrate.

3. The semiconductor memory device of claim 2, wherein, in the second trench portions, the second electrode portions are in the lower trench and the gate insulating layer encloses the second electrode portions.

4. The semiconductor memory device of claim 3, wherein the gate insulating layer is in the upper trench and the upper trench is free of the second electrode portions.

5. The semiconductor memory device of claim 1, wherein, in the first trench portions, the gate line structure further comprises capping insulating patterns on respective top surfaces of the first electrode portions.

6. The semiconductor memory device of claim 5, wherein each of the capping insulating patterns is between opposing sidewalls of the gate insulating layer.

7. The semiconductor memory device of claim 5,
wherein the capping insulating patterns comprise first capping insulating patterns comprising a first width and second capping insulating patterns comprising a second width that is narrower than the first width, and
wherein the first capping insulating patterns and the second capping insulating patterns alternate with each other in a direction that intersects the first width and the second width.

8. The semiconductor memory device of claim 5, wherein the gate electrode protrudes toward the top surface of the substrate, between the capping insulating patterns.

9. The semiconductor memory device of claim 1,
wherein bottom surfaces of the second trench portions are located at a level closer than bottom surfaces of the first trench portions to the top surface of the substrate.

10. The semiconductor memory device of claim 1,
wherein the rounded top surface of each of the second electrode portions has a convex shape.

11. A semiconductor memory device comprising:
a substrate;
a device isolation layer defining active regions of the substrate; and
a gate line structure comprising a gate insulating layer and a gate electrode that are buried in a trench of the substrate to cross the active regions,
wherein the trench comprises first trench portions on the device isolation layer and second trench portions on the active regions,
wherein the gate electrode comprises first electrode portions in the first trench portions and second electrode portions in the second trench portions,
wherein each of the second trench portions comprises a lower trench, and
wherein each of the second electrode portions is in the lower trench and the gate insulating layer encloses each of the second electrode portions.

12. The semiconductor memory device of claim 11, wherein each of the second trench portions comprises an upper trench comprising a first width and the lower trench comprising a second width that is greater than the first width.

13. The semiconductor memory device of claim 12, wherein, each of the second electrode portions has a convex top surface.

14. The semiconductor memory device of claim 13, wherein the gate insulating layer is in the upper trench and the upper trench is free of the gate electrode.

15. The semiconductor memory device of claim 11, wherein, in the first trench portions, the gate line structure further comprises capping insulating patterns on respective top surfaces of the first electrode portions.

16. A semiconductor memory device comprising:
a substrate;
a device isolation layer defining active regions of the substrate; and a gate line structure comprising a gate insulating layer and a gate electrode that are buried in a trench of the substrate to cross the active regions, wherein the trench comprises first trench portions on the device isolation layer and second trench portions on the active regions, wherein the gate electrode comprises first electrode portions in the first trench portions and second electrode portions in the second trench portions, wherein each of the second trench portions comprises an upper trench comprising a first width and a lower trench comprising a second width that is wider than the first width, wherein, in the second trench portions, the gate electrode is in the lower trench and the gate insulating layer encloses the gate electrode, and wherein the gate insulating layer is in the upper trench and the upper trench is free of the gate electrode.

17. The semiconductor memory device of claim 16, wherein, in the first trench portions, the gate line structure further comprises capping insulating patterns on respective top surfaces of the first electrode portions.

18. The semiconductor memory device of claim 1, wherein each of the second electrode portions further comprises a rounded bottom surface.

19. The semiconductor memory device of claim 18, wherein the rounded bottom surface of each of the second electrode portions has a convex shape.

20. The semiconductor memory device of claim 13, wherein each of the second electrode portions further comprises a convex bottom surface.

* * * * *